(12) United States Patent
Choi et al.

(10) Patent No.: US 11,417,709 B2
(45) Date of Patent: Aug. 16, 2022

(54) DISPLAY WITH ARRAY OF LIGHT-TRANSMITTING WINDOWS

(71) Applicant: Apple Inc., Cupertino, CA (US)

(72) Inventors: Minhyuk Choi, San Jose, CA (US); Rui Liu, San Jose, CA (US); Cheng Chen, San Jose, CA (US); Chin-Wei Lin, San Jose, CA (US); Sang Y. Youn, Cupertino, CA (US); Shih Chang Chang, Cupertino, CA (US); Tsung-Ting Tsai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 107 days.

(21) Appl. No.: 16/859,904

(22) Filed: Apr. 27, 2020

(65) Prior Publication Data

US 2020/0258950 A1 Aug. 13, 2020

Related U.S. Application Data

(63) Continuation of application No. 15/257,374, filed on Sep. 6, 2016, now Pat. No. 10,644,077.

(Continued)

(51) Int. Cl.
*H01L 27/32* (2006.01)
*G09G 3/3233* (2016.01)
(Continued)

(52) U.S. Cl.
CPC ....... *H01L 27/3216* (2013.01); *G09G 3/3233* (2013.01); *H01L 27/3227* (2013.01);
(Continued)

(58) Field of Classification Search
CPC .............. G09G 3/3233; H01L 27/3216; H01L 27/3227; H01L 27/3262; H01L 27/3265;
(Continued)

(56) References Cited

U.S. PATENT DOCUMENTS 5,726,443 A * 3/1998 Immega ............... H03K 17/941
  250/227.2
6,339,429 B1   1/2002 Schug
(Continued)

FOREIGN PATENT DOCUMENTS

EP   1335430 A1   8/2003
EP   2144293 B1   1/2010
(Continued)

*Primary Examiner* — Allan R Wilson
(74) *Attorney, Agent, or Firm* — Treyz Law Group, P.C.; G. Victor Treyz; Kendall P. Woodruff

(57) ABSTRACT

A display may have an array of pixels. Each pixel may have a light-emitting diode such as an organic light-emitting diode. The organic light-emitting diodes may each have an anode that is coupled to a thin-film transistor pixel circuit for controlling the anode. Transparent windows may be formed in the display. The windows may be formed by replacing data storage capacitors and other pixel circuit structures in a subset of the pixels with transparent window structures, by selectively removing portions of light-emitting diode anodes, and by shifting anodes. An array of electrical components such as an array of light sensors may be aligned with the transparent windows and may be used to measure light passing through the transparent windows.

20 Claims, 9 Drawing Sheets

Related U.S. Application Data

(60) Provisional application No. 62/247,543, filed on Oct. 28, 2015.

(51) Int. Cl.
*H01L 51/52* (2006.01)
*H01L 31/0232* (2014.01)

(52) U.S. Cl.
CPC ...... *H01L 27/3262* (2013.01); *H01L 27/3265* (2013.01); *H01L 27/3276* (2013.01); *H01L 31/0232* (2013.01); *H01L 51/5209* (2013.01); *G09G 2300/0452* (2013.01); *G09G 2300/0842* (2013.01)

(58) Field of Classification Search
CPC ............. H01L 27/3276; H01L 31/0232; H01L 51/5209
See application file for complete search history.

(56) References Cited

U.S. PATENT DOCUMENTS

| | | | |
|---|---|---|---|
| 6,430,325 B1 | 8/2002 | Shimoda | |
| 6,459,436 B1 | 10/2002 | Kumada | |
| 7,164,961 B2 | 1/2007 | Mei et al. | |
| 7,460,196 B2 | 12/2008 | Kim | |
| 7,468,721 B2 | 12/2008 | Nakano | |
| 7,804,493 B2 | 9/2010 | Gettemy | |
| 7,825,891 B2 | 11/2010 | Yao et al. | |
| 7,960,682 B2 | 6/2011 | Gardner, Jr. | |
| 8,194,031 B2 | 6/2012 | Yao et al. | |
| 8,330,909 B2 | 12/2012 | Yoshida et al. | |
| 8,361,818 B2 | 1/2013 | Cho et al. | |
| 8,384,003 B2 | 2/2013 | Gardner, Jr. | |
| 8,947,627 B2 | 2/2015 | Rappoport et al. | |
| 8,987,652 B2 | 3/2015 | Zheng et al. | |
| 9,024,530 B2 | 5/2015 | Land et al. | |
| 9,028,718 B2 | 5/2015 | Kijima et al. | |
| 9,129,548 B2 | 5/2015 | Zheng et al. | |
| 9,070,648 B2 | 6/2015 | Jong et al. | |
| 9,223,442 B2 | 12/2015 | Hoffman | |
| 9,245,934 B2 | 1/2016 | Chung et al. | |
| 9,299,748 B2 | 3/2016 | Schicktanz et al. | |
| 9,310,843 B2 | 4/2016 | Shedletsky et al. | |
| 9,354,735 B2 | 5/2016 | Abileah et al. | |
| 9,466,653 B2 | 10/2016 | Jong et al. | |
| 10,381,431 B1 | 8/2019 | Choi et al. | |
| 10,984,752 B2* | 4/2021 | Aflatooni ................. | G09G 5/10 |
| 2001/0000676 A1 | 5/2001 | Zhang et al. | |
| 2002/0079512 A1 | 6/2002 | Yamazaki et al. | |
| 2003/0174870 A1 | 9/2003 | Kim et al. | |
| 2003/0189211 A1 | 10/2003 | Deitz | |
| 2003/0189586 A1 | 10/2003 | Vronay | |
| 2004/0036820 A1 | 2/2004 | Runolinna | |
| 2004/0095402 A1 | 5/2004 | Nakano | |
| 2004/0140762 A1 | 7/2004 | Tohma et al. | |
| 2005/0056842 A1 | 3/2005 | Nashi et al. | |
| 2005/0219197 A1 | 10/2005 | Pasqualini et al. | |
| 2006/0033016 A1 | 2/2006 | Ogawa et al. | |
| 2006/0049533 A1 | 3/2006 | Kamoshita | |
| 2006/0238517 A1 | 10/2006 | King et al. | |
| 2006/0267625 A1 | 11/2006 | Kaneko | |
| 2007/0013629 A1* | 1/2007 | Matsumoto ......... | H01L 27/3276 345/92 |
| 2007/0236485 A1 | 10/2007 | Trepte | |
| 2007/0257254 A1 | 11/2007 | Yang et al. | |
| 2008/0084374 A1 | 4/2008 | Abileah et al. | |
| 2008/0158173 A1 | 7/2008 | Hamblin et al. | |
| 2008/0284716 A1 | 11/2008 | Edwards | |
| 2009/0002341 A1 | 1/2009 | Saito et al. | |
| 2009/0033850 A1 | 2/2009 | Ishiguro et al. | |
| 2009/0102763 A1 | 4/2009 | Border et al. | |
| 2010/0079426 A1 | 4/2010 | Pance et al. | |
| 2010/0148163 A1 | 6/2010 | Im et al. | |
| 2010/0177046 A1 | 7/2010 | Shin et al. | |
| 2010/0273530 A1 | 10/2010 | Jarvis et al. | |
| 2010/0302196 A1 | 12/2010 | Han et al. | |
| 2011/0122560 A1 | 5/2011 | Andre et al. | |
| 2011/0216042 A1 | 9/2011 | Wassvik et al. | |
| 2011/0220922 A1 | 9/2011 | Kim et al. | |
| 2011/0227873 A1 | 9/2011 | Chung et al. | |
| 2011/0234538 A1 | 9/2011 | Chen et al. | |
| 2011/0248961 A1 | 10/2011 | Svajda et al. | |
| 2012/0043894 A1 | 2/2012 | Koh et al. | |
| 2012/0153153 A1 | 6/2012 | Chang et al. | |
| 2012/0176298 A1 | 7/2012 | Suh et al. | |
| 2012/0194441 A1 | 8/2012 | Frey | |
| 2012/0218239 A1 | 8/2012 | Yao et al. | |
| 2012/0267611 A1 | 10/2012 | Chung et al. | |
| 2013/0002731 A1 | 1/2013 | Tam | |
| 2013/0076712 A1 | 3/2013 | Zheng et al. | |
| 2013/0094126 A1 | 4/2013 | Rappoport et al. | |
| 2013/0106813 A1 | 5/2013 | Hotelling et al. | |
| 2013/0161489 A1 | 6/2013 | Gardner | |
| 2014/0085265 A1 | 3/2014 | Yin | |

FOREIGN PATENT DOCUMENTS

| | | |
|---|---|---|
| EP | 2432196 B1 | 3/2012 |
| TW | 201237962 A | 9/2012 |
| WO | 2000/41378 A1 | 7/2000 |
| WO | 2002/37454 A2 | 5/2002 |
| WO | 2007/069107 A3 | 6/2007 |
| WO | 2017048478 A1 | 3/2017 |

\* cited by examiner

DISPLAY WITH ARRAY OF LIGHT-TRANSMITTING WINDOWS

This application is a continuation of patent application Ser. No. 15/257,374, filed Sep. 6, 2016, which claims the benefit of provisional patent application No. 62/247,543, filed Oct. 28, 2015, both of which are hereby incorporated by reference herein in their entireties.

BACKGROUND

This relates generally to electronic devices, and, more particularly, to electronic devices with displays.

Electronic devices often include displays. Displays such as organic light-emitting diode displays have pixels with light-emitting diodes. The light emitting diodes each have electrodes (i.e., an anode and a cathode). Emissive material is interposed between the electrodes. During operation, current passes through the emissive material between the electrodes, generating light.

The electrodes in an organic light-emitting diode display are formed from a photolithographically patterned layer of conductive material. Electrodes are organized in a regularly spaced array. This type of arrangement simplifies the layout of thin-film transistor circuits for the display.

It may be desirable to incorporate electrical components into a display. If care is not taken, the electrodes and other circuitry in a display may interfere with these components.

It would therefore be desirable to be able to provide improved display arrangements for accommodating the addition of electrical components.

SUMMARY

A display may have an array of pixels. Each pixel may have a light-emitting diode such as an organic light-emitting diode. The organic light-emitting diodes may each have an anode that is coupled to a thin-film transistor pixel circuit for controlling the anode.

Transparent windows may be formed in the display. The windows may be formed by replacing data storage capacitors and other pixel circuit structures in some of the pixels with transparent window structures. If desired, windows may be accommodated by selectively removing portions of the anodes in some of the pixels. Configurations may also be used in which the anodes in some of the pixels are shifted relative to the anodes in the other pixels.

An array of electrical components may be aligned with the transparent windows. For example, the display may have an array of light transmitting windows each of which is aligned with a respective light detector that measures light passing through that light transmitting window.

Further features will be more apparent from the accompanying drawings and the following detailed description.

DETAILED DESCRIPTION

Figure 1:
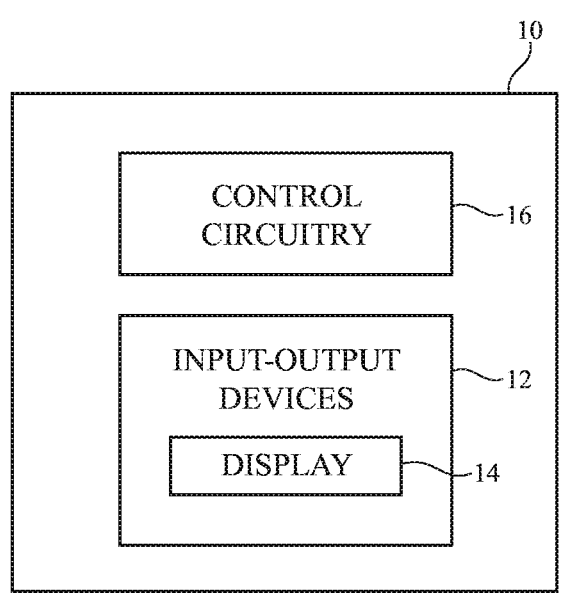
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, and other electrical components. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications.

During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
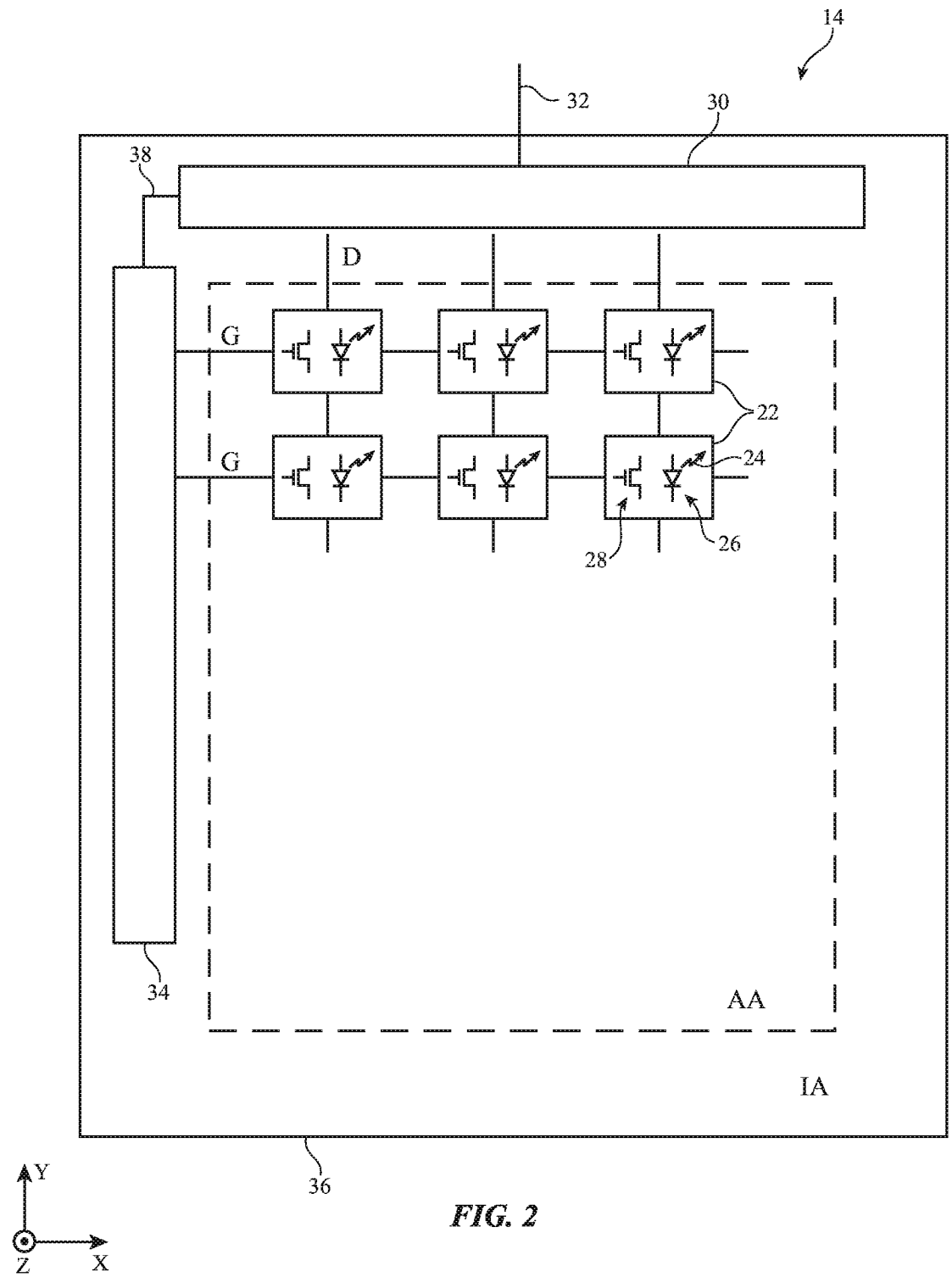
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel circuit formed from thin-film transistor circuitry such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 22 may contain light-emitting diodes of different colors (e.g., red, green, and blue diodes for red, green, and blue pixels, respectively) to provide display 14 with the ability to display color images.

Pixels 22 may be arranged in a rectangular array or an array of other shapes. The array of pixels 22 forms an active area AA for display 14 and is used in displaying images for a user. Inactive portions of display 14 such as inactive area IA may run along one or more of the edges of active area AA. Inactive area IA may be free of pixels 22.

Display driver circuitry may be used to control the operation of pixels 22. The display driver circuitry may be formed from integrated circuits, thin-film transistor circuits, or other suitable circuitry and may be located in inactive area IA. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Figure 3:
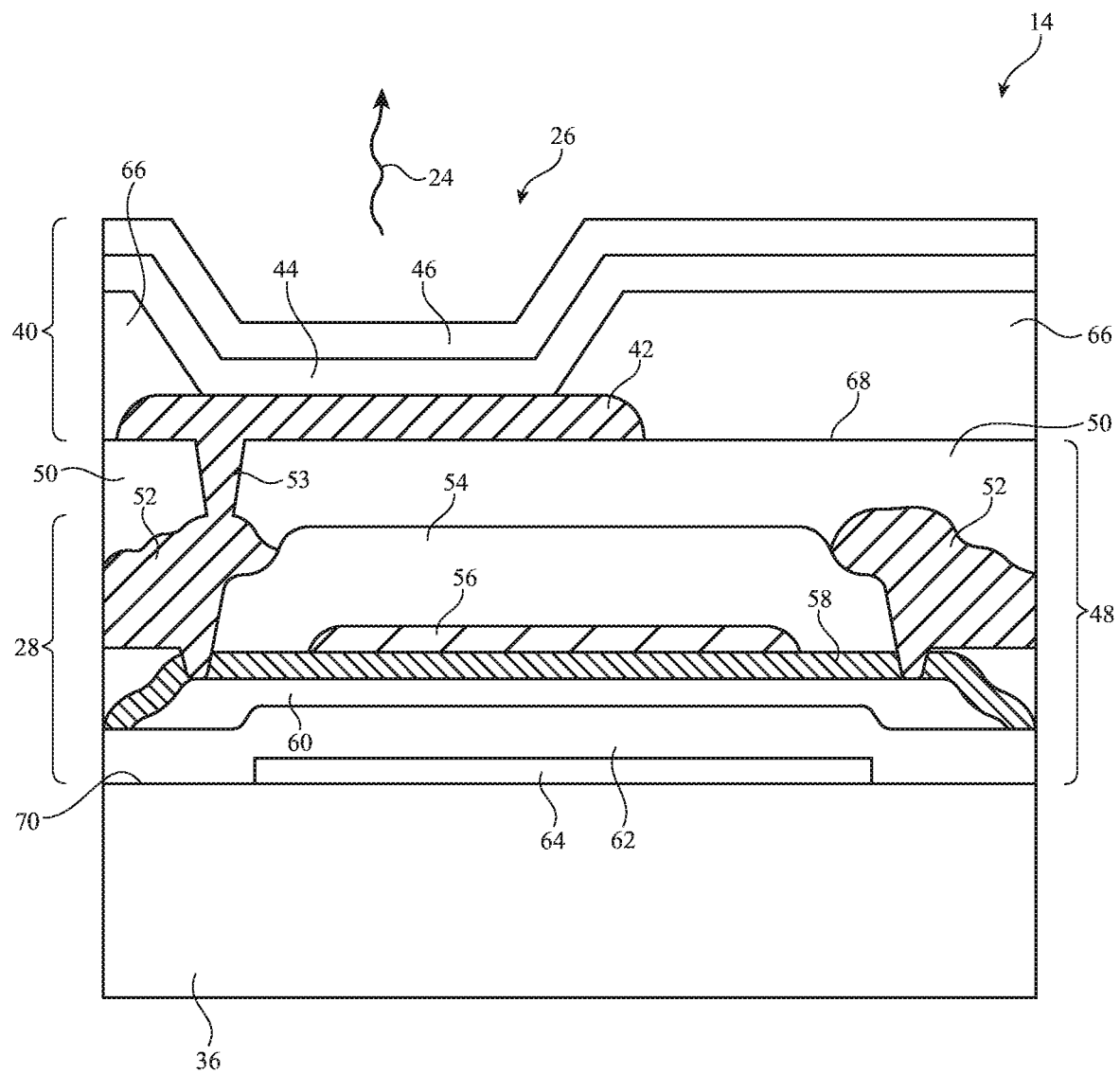
FIG. 3 is a cross-sectional side view of a portion of an illustrative organic light-emitting diode display in accordance with an embodiment.

A cross-sectional side view of a portion of an illustrative organic light-emitting diode display that includes a light-emitting diode (diode 26) and thin-film transistor circuitry 48 for an associated pixel circuit is shown in FIG. 3. As shown in FIG. 3, display 14 may include a substrate layer such as substrate layer 36. Substrate 36 may be a planar layer or a non-planar layer and may be formed from plastic, glass, ceramic, sapphire, metal, or other suitable materials. The surface of substrate 36 may, if desired, be covered with one or more buffer layers (e.g., inorganic buffer layers such as layers of silicon oxide, silicon nitride, etc.).

Thin-film transistor circuitry 48 may be formed on substrate 36. The thin film transistor circuitry may include transistors, capacitors, and other thin-film structures. As shown in FIG. 3, a transistor such as thin-film transistor 28 may be formed from thin-film semiconductor layer 60. Semiconductor layer 60 may be a polysilicon layer, a semiconducting-oxide layer such as a layer of indium gallium zinc oxide, or other semiconductor layer. Gate layer 56 may be a conductive layer such as a metal layer that is separated from semiconductor layer 60 by an intervening layer of dielectric such as dielectric 58 (e.g., an inorganic gate insulator layer such as a layer of silicon oxide). Dielectric 62 may also be used to separate semiconductor layer 60 from underlying structures such as shield layer 64 (e.g., a shield layer that helps shield the transistor formed from semiconductor layer 60 from charge in buffer layers on substrate 36).

Semiconductor layer 60 of transistor 28 may be contacted by source and drain terminals formed from source-drain metal layer 52. Dielectric layer 54 (e.g., an inorganic interlayer dielectric layer) may separate gate metal layer 56 from source-drain metal layer 52. Pixel circuits formed from thin-film transistor circuitry 48 may be shorted to anode 42 of light-emitting diode 26 using a metal via such as via 53. Via 53 may, for example, be coupled to transistor structures such as source-drain metal layer 52 and may pass through dielectric planarization layer 50. Planarization layer 50 may be formed from an organic dielectric material such as a polymer.

Light-emitting diode 26 is formed from light-emitting diode layers 40 on thin-film transistor layers 48. Each light-emitting diode has a lower electrode and an upper electrode. In a top emission display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semitransparent metal and/or a layer of indium tin oxide or other transparent conductive material). This allows the upper electrode to transmit light outwards that has been produced by emissive material in the diode. In a bottom emission display, the lower electrode may be transparent (or semi-transparent) and the upper electrode may be reflective.

In configurations in which the anode is the lower electrode, layers such as a hole injection layer, hole transport layer, emissive material layer, and electron transport layer may be formed above the anode and below the upper electrode, which serves as the cathode for the diode. In inverted configurations in which the cathode is the lower electrode, layers such as an electron transport layer, emissive material layer, hole transport layer, and hole injection layer may be stacked on top of the cathode and may be covered with an upper layer that serves as the anode for the diode. Both electrodes may reflect light.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 3, display 14 has a top emission configuration and lower electrode 42 is an anode and upper electrode 46 is a cathode. Layers 40 include a patterned metal layer that forms anodes such as anode 42. Anode 42 is formed within an opening in pixel definition layer 66. Pixel definition layer 66 may be formed from a patterned photoimageable polymer such as polyimide. In each light-emitting diode, organic emissive material 44 is interposed between a respective anode 42 and cathode 46. Anodes 42 may be patterned from a layer of metal on a planarization layer in the thin-film transistor layers of pixel circuit 48 such as planarization layer 50. Cathode 46 may be formed from a common conductive layer that is deposited on top of pixel definition layer 66. Cathode 46 is transparent so that light 24 may exit light emitting diode 26 as current is flowing through emissive material 44 between anode 42 and cathode 46.

Display 14 may have an array of pixels 22 of different colors to provide display 14 with the ability to display color images. The pixels may include red pixels, green pixels, and blue pixels. White pixels, yellow pixels, and pixels of other colors may also be included in display 14, if desired. The pixels may have rectangular emissive areas (e.g., rectangular anode shapes) and/or may have emissive areas of other suitable shapes (e.g., diamond shapes, etc.).

Figure 4:
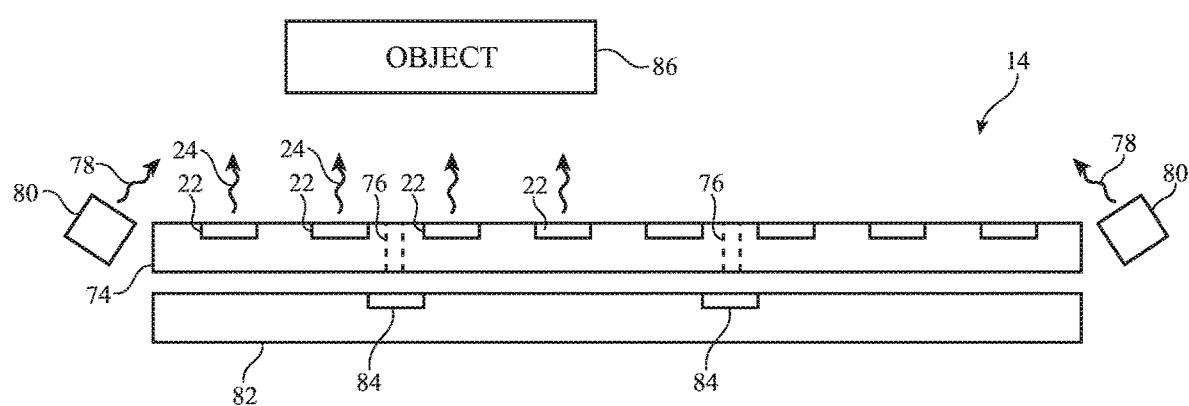
FIG. 4 is a cross-sectional side view of a display with an array of electrical components in accordance with an embodiment.

It may be desirable to incorporate electrical components into display 14 and/or device 10. As shown in FIG. 4, for example, electrical components 84 may be incorporated into device 10 under pixels 22. Components 84 may be discrete components or may be formed as part of a common integrated circuit or other shared component (see, e.g., component 82, which may be an integrated circuit). If desired, components 84 may be mounted on a common substrate such as a printed circuit (e.g., a component 82 may be a rigid printed circuit board formed from a rigid printed circuit board material such as fiberglass-filled epoxy or a flexible printed circuit formed from a flexible layer of polyimide or other sheet of polymer). Components 84 may be integrated into the layers that make up display 14 and/or may be mounted in alignment with display 14.

Electrical components 84 may be audio components (e.g., microphones, speakers, etc.), radio-frequency components, haptic components (e.g., piezoelectric structures, vibrators, etc.), may be capacitive touch sensor components or other touch sensor structures, may be temperature sensors, pressure sensors, magnetic sensors, or other sensors, or may be any other suitable type of electrical component. With one suitable arrangement, which may sometimes be described herein as an example, electrical components 84 may be light-based components (e.g., components that emit and/or detect visible light, infrared light, and/or ultraviolet light).

Light-based components 84 may emit and/or detect light that passes through transparent windows 76 in display 14. Windows 76 may be formed between the pixel circuitry and emissive areas of pixels 22 and may include transparent materials (e.g., clear plastic, glass, etc.) and/or holes (e.g., air-filled openings or openings filled with transparent material that pass partly or fully through substrate 36 and other display layers 74 of display 14). There may be a window 76 between each set of adjacent pixels 22 or, more preferably, blocks of pixels 22 (e.g., blocks of tens, hundreds, or thousands of pixels) may be associated with windows 76 and electrical components 84. For example, additional space may be created within some of pixels 22 to accommodate windows 76 and components 84. There may be, as an example, a window 76 associated with each block of 100 pixels 22 or other suitable number of pixels 22 (e.g., each 50 pixels or more, each 200 pixels or more, each 100 pixels or more, each 50 or fewer pixels, each 200 or fewer pixels, etc. If desired, some components may be mounted on the upper surface of display 14 (in which cases windows 76 need not be provided through layers 74 of display 14).

Examples of light-based components 84 that emit light include light-emitting diodes (e.g., organic light-emitting diodes, discrete crystalline light-emitting diode dies, etc.), lasers, and lamps. Examples of light-based components that detect light include light detectors such as photodiodes and phototransistors. Some components may, if desired, include both light emitters and detectors. For example, components 84 may emit infrared light and may include light detector structures for detecting a portion of the emitted light that has reflected from nearby objects such as object 86. Components of this type may be used to implement a proximity detector, a light-based fingerprint sensor (e.g., when object 86 is the finger of a user), or other light-based sensor. If desired, light-based sensors such as these may be implemented by illuminating object 86 with light 24 from one or more of pixels 22 and/or light 78 from one or more supplemental light sources such as discrete light-emitting diodes 80, while using light-detecting components 84 to gather reflected light from object 86.

Control circuitry 16 may be used in controlling the emission of light from light sources such as pixels 22, components 84, and/or light sources 80 and may be used in processing corresponding detected light from components 84 (e.g., to generate a proximity sensor signal based on light reflected from object 86, to generate a fingerprint reading based on light reflected from object 86, to process a captured digital image of a far-field object, that is captured using components 84, etc.).

Figure 5:
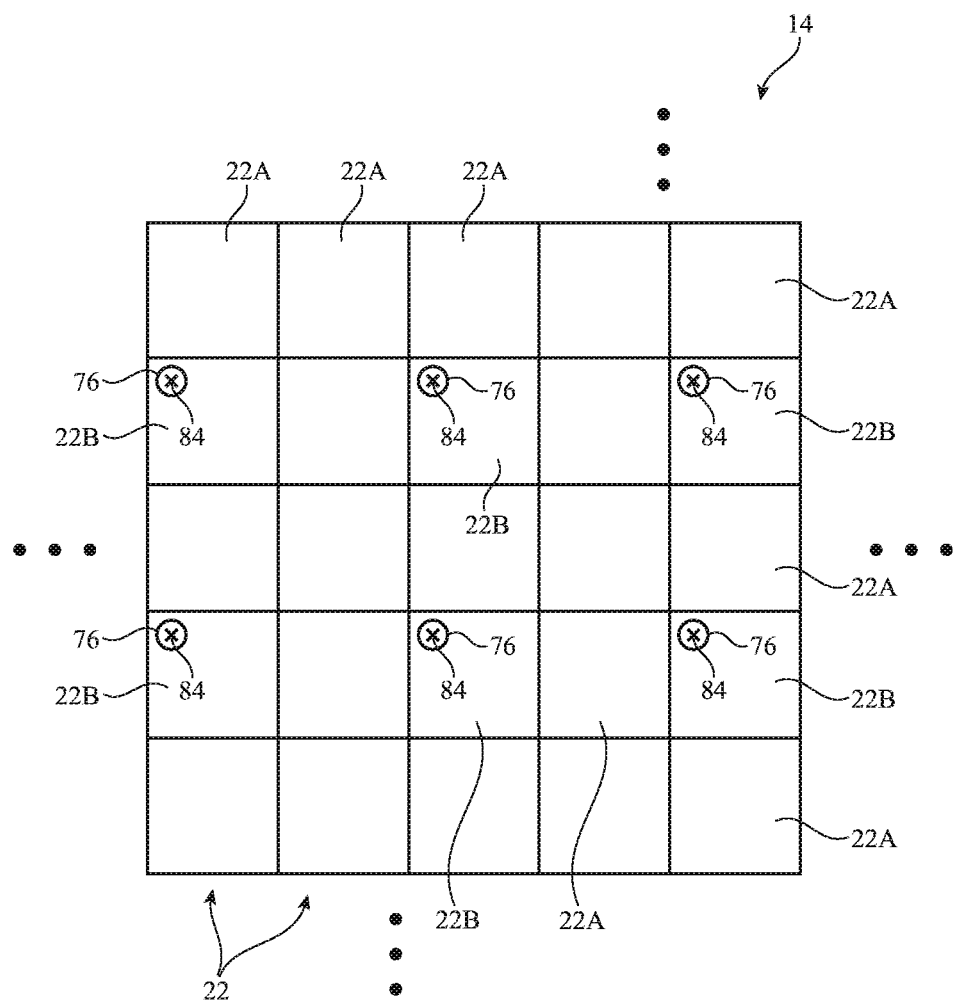
FIG. 5 is a top view of an illustrative display with an array of electrical components mounted behind windows that are located within selected pixels in the display in accordance with an embodiment.

Components 84 (and windows 76, if used) may be interspersed with pixels 22 using any suitable arrangement. With one illustrative configuration, which is shown in FIG. 5, windows 76 and components 84 are arranged in an array that has a larger pitch than the array of pixels 22 in display 14. There may be, for example, one window 76 and one corresponding component 84 for each set of 10-1000 pixels 22, for each set of 100-10,000 pixels, for each set of more than 500 pixels, or for each set of less than 5000 pixels (as examples). In configurations such as these, pixels 22 are arranged on display 14 with a finer pitch than windows 76 and components 84. Pixels 22 may, for example, be organized in an array having rows and columns and windows 76 and components 84 may be arranged in an array having a smaller number of rows and columns. Configurations in which windows 76 and components 84 are arranged in patterns other than rectangular arrays may also be used. Arrangements in which windows 76 and components 84 are arranged in rows and columns may sometimes be described herein as an example. Windows 76 may cover all of active area AA or may be confined to a portion of active area AA. If desired, some of windows 76 may extend into inactive area IA.

To make room for windows 76 in the pixels of active area AA, it may be desirable to remove some of the normal pixel circuitry of some of these pixels. For example, pixels 22A of FIG. 5 may contain complete pixel circuits for controlling corresponding light-emitting diodes 26 (i.e., pixel circuits that contain a full complement of thin-film transistors and capacitors), whereas pixels 22B may contain incomplete pixel circuits (i.e., circuits similar to the circuits of pixels 22A from which one or more transistors and/or capacitors or all of the transistors and capacitors of pixels 22A have been removed and replaced with windows 70). By removing some or all of the normal pixel circuitry used in controlling the light-emitting diode of each of pixels 22B, additional area may be made available in pixels 22B to accommodate windows 76. To make up for the removed pixel circuitry of pixels 22B, ancillary pixel circuits can be formed in inactive area IA along the edge of display 14. Signal lines may then be used to route signals between the light-emitting diodes of pixels 22B and the ancillary pixel circuits in the inactive area.

Figure 6:
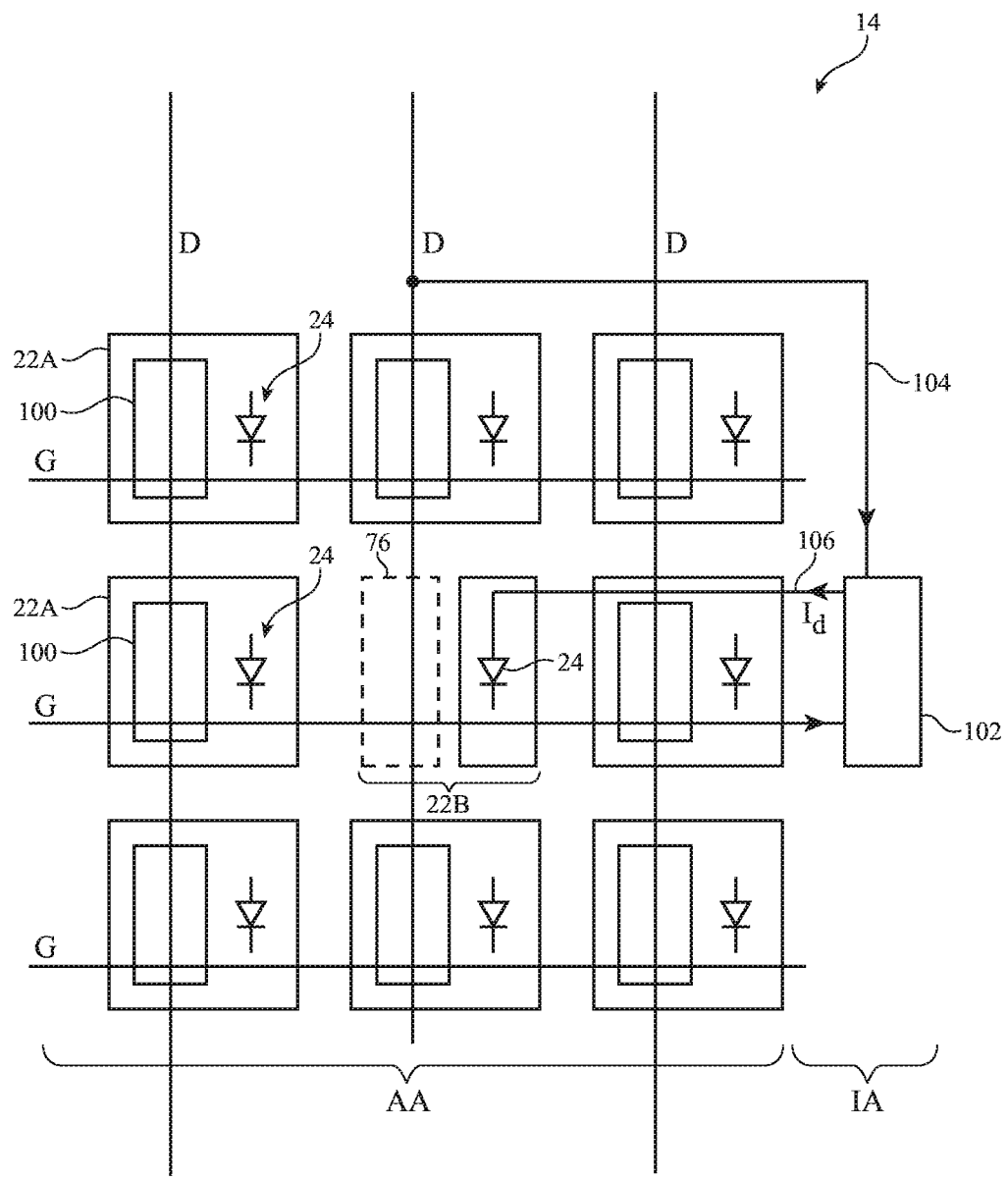
FIG. 6 is a circuit diagram of an illustrative display having modified pixels to accommodate windows for light-based components in accordance with an embodiment.

FIG. 6 is a diagram of an illustrative display in which pixel circuitry has been removed from pixel 22B in active area AA and replaced with a window 76. The functions of the removed pixel circuitry are performed by ancillary pixel circuitry 102 in inactive area IA.

As shown in FIG. 6, each normal pixel 22A has a light-emitting diode 24 and an associated pixel circuit 100. The pixel circuit 100 of each normal pixel 22A includes a drive transistor that is coupled in series with the light-emitting diode 24 of that pixel for controlling the amount of drive current that passes through that light-emitting diode. Switching transistors and one or more capacitors (e.g., data storage capacitors for storing loaded data signals, etc.) may also be included in each pixel circuit 100.

In windowed pixels such as pixel 22B of FIG. 6, some or all of the thin-film circuitry associated with circuit 100 is removed, thereby creating at transparent area through display 14 for window 76. During operation of display 14, data signals for pixel 22B may be routed to ancillary pixel circuit 102 using ancillary data line 104. Pixel circuitry 102 may have an ancillary drive transistor and/or other ancillary pixel circuitry (e.g., an ancillary data storage capacitor) that uses the data signal on ancillary data line 104 to produce a corresponding drive current Id for light-emitting diode 24 of pixel 22B. Ancillary drive current path (line) 106 may route drive current Id to light-emitting diode 24 in pixel 22B from ancillary pixel circuit 102.

Other techniques may be used for making up for the pixel circuitry removed from pixel 22 under window 76 if desired. The use of ancillary pixel circuitry such as circuitry 102 in inactive area IA and supplemental signal lines such as ancillary data line 104 and ancillary drive current line 106 is merely illustrative. Moreover, other modifications may be made to pixels 22B to help accommodate windows 76 in addition to or instead of replacing pixel circuitry with windows 76 such as selectively removing portions of anodes 42 and/or shifting anodes 42 in pixels 22B relative to the anodes 42 in normal pixels 22A, etc.

Figure 7:
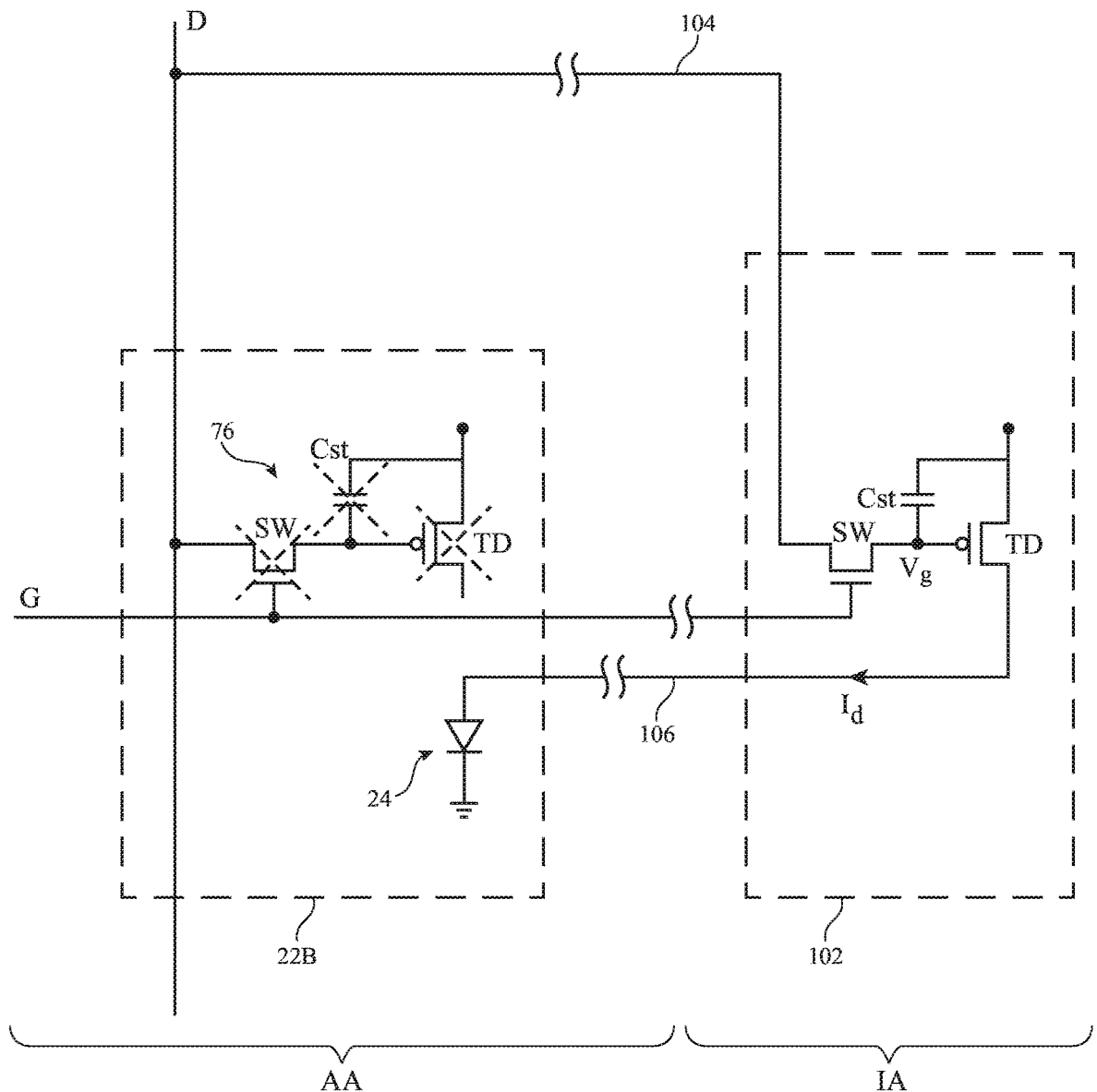
FIG. 7 is a circuit diagram of an illustrative display showing how a pixel circuit formed in an inactive display area may be used to control a light-emitting diode in a pixel in which pixel circuitry has been removed to accommodate a light transmitting window in accordance with an embodiment.

An example of circuitry that may be used for display 14 is shown in FIG. 7. In the FIG. 7 example, each pixel circuit may contain a drive transistor TD, a data storage capacitor Cst, and a switching transistor SW. Other types of pixel circuits may be used in pixels 22, if desired. For example, the pixel circuits of pixels 22A and ancillary circuits 102 may have additional switching transistors, emission control transistors, additional capacitors, etc. The pixel circuitry of FIG. 7 is merely illustrative.

In normal pixels 22A of FIG. 7, a full set of pixel circuit components is present (e.g., drive transistor TD, switching transistor SW, and storage capacitor Cst. In pixels 22B, some or all of these pixel circuit components may be removed and replaced with window 76. To make up for the pixel circuit components removed from pixel 22B, ancillary pixel circuit 102 may be formed in inactive area IA that contains the removed components. For example, in a scenario in which switching transistor SW, drive transistor TD, and storage capacitor Cst have been removed from pixel 22B, ancillary pixel circuit 102 may include switching transistor SW, drive transistor TD, and storage capacitor Cst.

During operation, gate line G may be asserted, thereby turning on switching transistor SW in ancillary pixel circuit 102 and loading data from data line D onto capacitor Cst via ancillary data line 104 and switching transistor SW. This establishes a desired voltage Vg on the gate of drive transistor TD in circuit 102 and thereby establishes a desired value for drive current Id. Ancillary pixel circuit 102 is located in inactive area IA and pixel 22B is located in active area AA. To ensure that light-emitting diode 24 in pixel 22B emits a desired amount of light, ancillary drive current line 106 may be used to route drive current Id to light-emitting diode 24 in pixel 22B from circuit 102.

Figure 8:
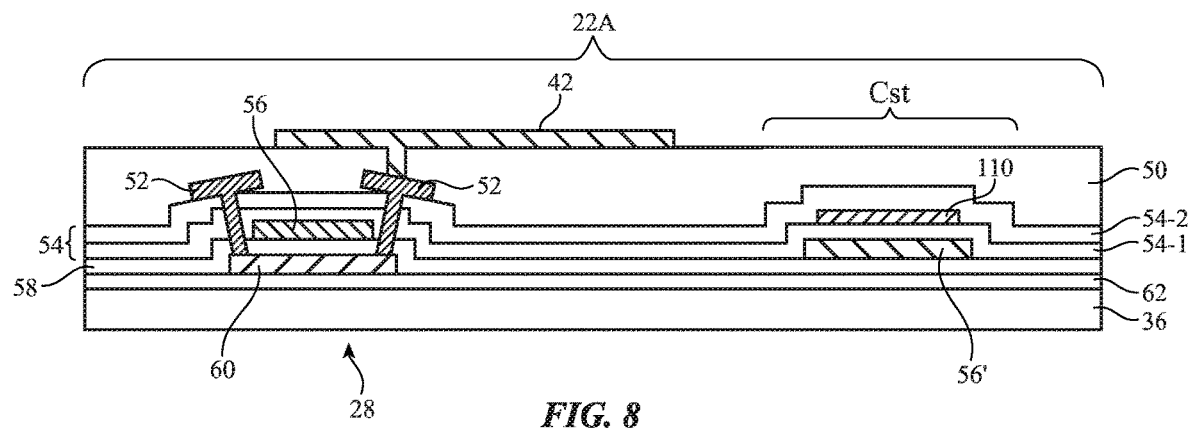
FIG. 8 is a cross-sectional side view of thin-film transistor circuitry of the type that may be associated with normal pixels on a display in accordance with an embodiment.

FIG. 8 is a cross-sectional side view of illustrative thin-film transistor circuitry of the type that may be used in normal pixels 22A. As shown in FIG. 8, pixel circuitry for pixel 22A may include transistors such as transistor 28, an anode such as anode 42 for light-emitting diode 24, and structures for forming storage capacitor Cst. In the example of FIG. 8, storage capacitor Cst has a first electrode (electrode 56') that is formed from a portion of the gate metal layer used in forming transistor gate 56 in transistor 28 and a second electrode (electrode 110) formed from a second gate metal layer that is interposed between interlayer dielectric layer 54-1 and interlayer dielectric layer 54-2 of layer 54. Other storage capacitor arrangements may be used, if desired. Pixel 22A may be free of transparent window structures.

Figure 9:
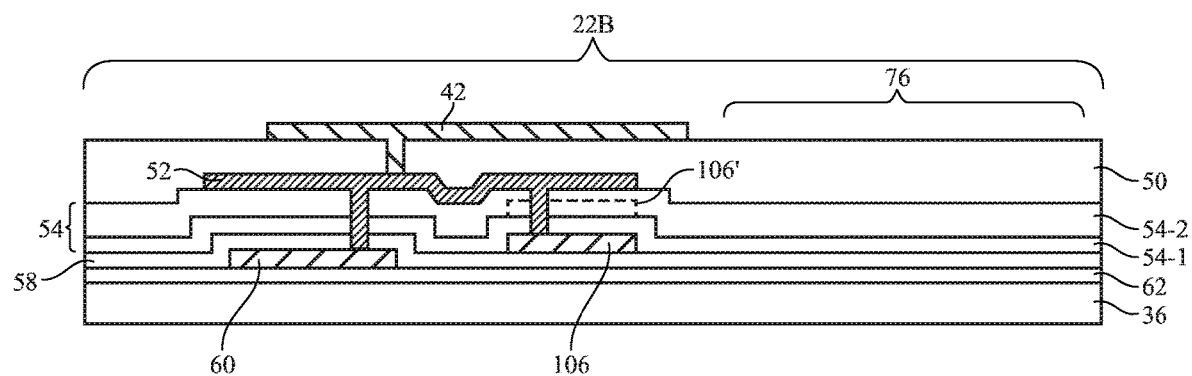
FIG. 9 is a cross-sectional side view of thin-film transistor circuitry of the type that may be associated with pixels in which pixel circuitry has been removed to accommodate light transmitting windows in accordance with an embodiment.

To make room for window 76, transistor structures and other structures may be removed from some of the pixels in display 14 as described in connection with pixel 22B of FIG. 7 (i.e., pixels 22B may be free of data storage capacitors and may, if desired, be free of switching transistors and/or drive transistors). FIG. 9 is a cross-sectional side view of illustrative thin-film transistor circuitry of the type that may be used in pixels 22B that contain windows 76. As shown in FIG. 9, the electrode structures associated with capacitor Cst may be removed, so that region 76 is transparent and can serve as light-transparent window 76 in place of capacitor Cst. In the area normally used for forming transistors, layers such a layer 60 may be patterned to form signal interconnects to route other signals between components in remaining circuitry in pixel 22). Supplemental paths 106 (e.g., supplemental drive current lines such as supplemental lines 106 of FIGS. 6 and 7) may be formed from a patterned portion of the gate metal layer (layer 56 of normal pixel circuits 22A) or may, as illustrated by optional path 106' be formed from a portion of the second gate metal layer (i.e., the layer used to form electrode 110 of FIG. 8). The second gate metal layer may be interposed between interlayer dielectric layers 54-1 and 54-2.

Figure 10:
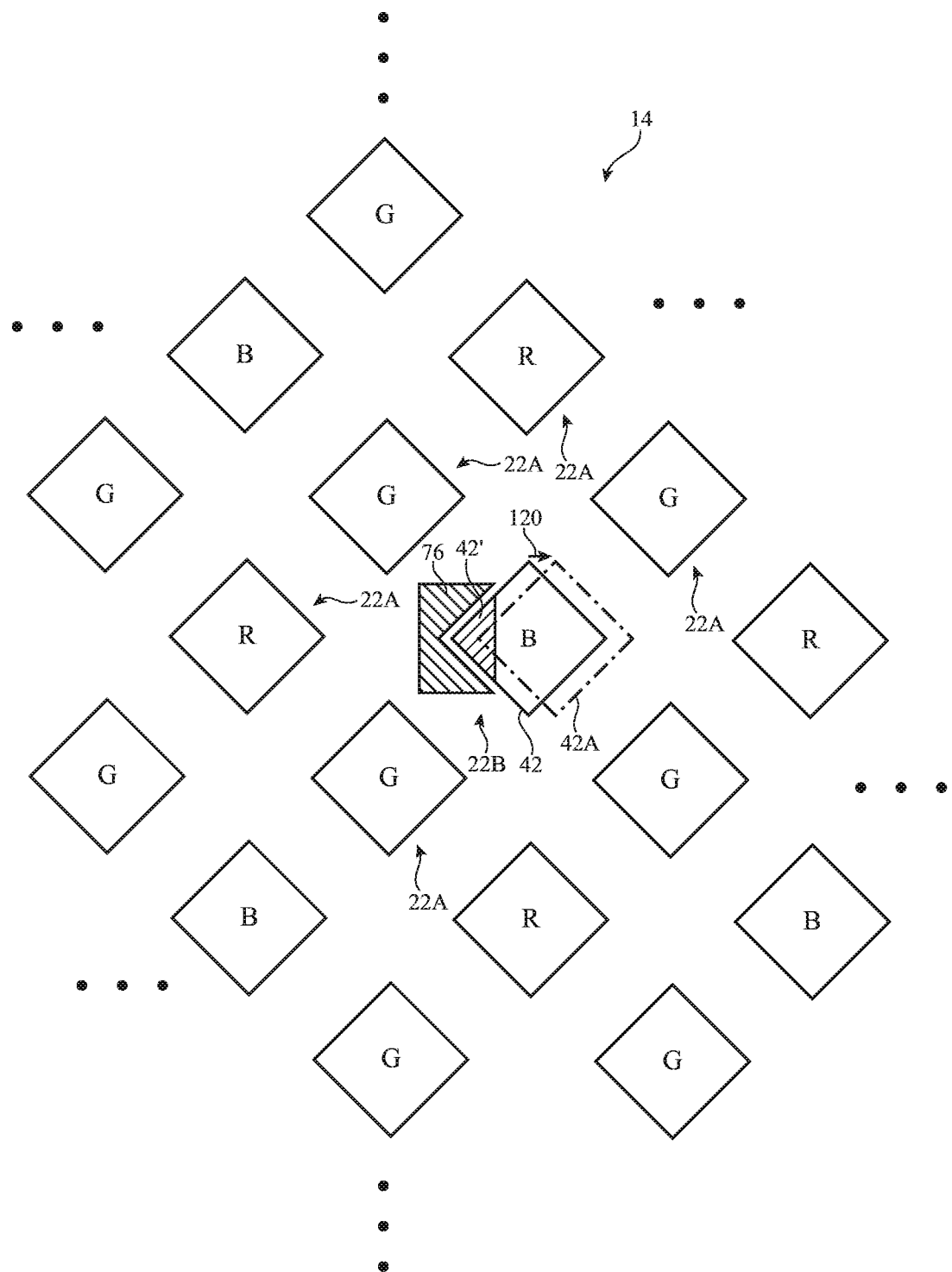
FIG. 10 is a top view of an illustrative display having an array of diamond-shaped pixels showing how pixels may be selectively modified to accommodate light transmitting windows in accordance with an embodiment.

Pixels 22 may be arranged in an RGB stripe pattern or other suitable pattern. Pixels 22 may include pixels such as red pixels, green pixels, and blue pixels each of which may have anodes of the same size or different sizes (e.g., the red and green anodes may be different in size from the blue anodes). If desired, windows 76 may be formed in displays with diamond shaped emissive areas, as illustrated by the diamond-shaped pixels of FIG. 10. In the example of FIG. 10, display 14 has an array of diamond shaped emissive areas in red pixels R, green pixels G, and blue pixels B.

By deleting some or all of the components of pixel 22B (e.g., storage capacitor Cst and, if desired, one or more transistors in the pixel circuitry of pixel 22B) from window regions such as illustrative window region 76 in pixel 22B, an array of windows 76 may be formed in display 14. Windows such as window 76 may be formed in blue pixels or in pixels of other colors (e.g., red pixels or green pixels). If desired, a portion of anode 42 such as portion 42' may be removed to enlarge window 76 (i.e., the anodes 42 in pixels 22B may be smaller than the anodes of the same color in pixels 22A). Window 76 can also be accommodated and/or enlarged by shifting the location of anode 42 relative to the anodes in normal pixels 22A, as indicated by arrow 120 and alternate anode location 42A. Combinations of these approaches (e.g., deletion of one or more pixel circuit components from area 76 adjacent to anode 42, enlargement of area 76 by removing portion 42' of anode 42, and/or shifting anode 42 to location 42A) may be used to accommodate windows in display 14, if desired. In displays with pixels of different colors (e.g., red, green, blue, etc.), anodes 42 for one or more (or all) of the different colored pixels may be shifted, may be reduced in size, and/or may have associated deleted pixel circuitry, anodes in adjacent pixels may be shifted away from each other to help make space for window 76, etc.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing;
   a display mounted in the housing and having an array of pixels including first and second groups of pixels, wherein the second group of pixels has pixel circuit elements that are excluded from the first group of pixels to accommodate window regions in the display; and
   a fingerprint sensor located behind the array of pixels, wherein the fingerprint sensor emits and detects signals through the window regions in the display.

2. The electronic device defined in claim 1 wherein the pixels comprise organic light-emitting diode pixels.

3. The electronic device defined in claim 1 wherein the display comprises a substrate on which the array of pixels is located.

4. The electronic device defined in claim 3 wherein the window regions comprise holes in the substrate.

5. The electronic device defined in claim 4 wherein the holes pass from an upper surface to a lower surface of the substrate.

6. The electronic device defined in claim 1 wherein the display has an active area and an inactive area, wherein the array of pixels is located in the active area, and wherein at least some of the pixel circuitry associated with the first group of the pixels is located in the inactive area of the display.

7. The electronic device defined in claim 6 wherein the pixel circuitry associated with the first group of the pixels comprises drive current lines each of which extends between the inactive area and one of the pixels in the first group.

8. The electronic device defined in claim 7 wherein each of the pixels in the second group include a data storage capacitor and wherein the pixels in the first group are free of data storage capacitors.

9. The electronic device defined in claim 1 wherein the window regions comprise light-transmitting window regions.

10. The electronic device defined in claim 1 wherein the fingerprint sensor comprises a light-based fingerprint sensor.

11. An electronic device, comprising:
    a display comprising an array of pixels on a substrate;
    window regions within the array of pixels, wherein the array of pixels comprises first and second groups of pixels and wherein the second group of pixels has pixel circuit elements that are excluded from the first group of pixels to accommodate the window regions; and
    a microphone behind the substrate that detects signals that pass through the window regions within the array of pixels.

12. The electronic device defined in claim 11 wherein the first group of the pixels has less pixel circuitry than the second group of the pixels.

13. The electronic device defined in claim 12 wherein the display comprises an active area and an inactive area and wherein at least some of the pixel circuitry associated with the first group of the pixels is located in the inactive area of the display.

14. The electronic device defined in claim 13 wherein the first group of pixels do not include storage capacitors.

15. The electronic device defined in claim 11 wherein the window regions comprise holes in the substrate.

16. An electronic device, comprising:
    a housing;
    a display mounted in the housing, wherein the display has an active area with an array of pixels including first and second groups of pixels, wherein the second group of pixels has pixel circuit elements that are excluded from the first group of pixels; and
    a proximity sensor located behind the array of pixels, wherein the proximity sensor emits signals that pass through the display and detects reflected signals that reflect from external objects near the display.

17. The electronic device defined in claim 16 wherein the proximity sensor detects a fingerprint.

18. The electronic device defined in claim 16 wherein the display comprises window regions within the array through which the signals and the reflected signals pass.

19. The electronic device defined in claim 16 wherein the display has an inactive area without pixels and wherein at least some of the pixel circuitry associated with the first group of the pixels is located in the inactive area.

20. The electronic device defined in claim 16 wherein the pixels in the first group do not include storage capacitors.

\* \* \* \* \*